United States Patent [19]
O'Sullivan et al.

[11] Patent Number: 6,061,244
[45] Date of Patent: May 9, 2000

[54] CARRIER FOR AN ELECTRONIC DEVICE

[75] Inventors: Hans O'Sullivan, Glencormac; Brendan Farrell, Dalkey, both of Ireland

[73] Assignee: Richmount Computers Limited, Dublin, Ireland

[21] Appl. No.: 08/966,941

[22] Filed: Nov. 10, 1997

[51] Int. Cl.[7] .................................. G06F 1/16; H05K 5/02
[52] U.S. Cl. ...................... 361/727; 361/726; 312/223.1
[58] Field of Search ................................ 361/683–685, 361/754, 798, 725–727; 312/223.1, 223.2; 439/157–160, 928.1

[56] References Cited

U.S. PATENT DOCUMENTS

| | | | |
|---|---|---|---|
| 5,319,519 | 6/1994 | Sheppard et al. | 361/685 |
| 5,383,789 | 1/1995 | Watanabe | 439/159 |
| 5,490,723 | 2/1996 | Driscoll et al. | 312/223.1 |
| 5,499,925 | 3/1996 | Lwee | 439/157 |
| 5,586,003 | 12/1996 | Schmitt et al. | 361/683 |
| 5,604,662 | 2/1997 | Anderson et al. | 361/685 |
| 5,765,933 | 6/1998 | Paul et al. | 312/223.1 |
| 5,790,374 | 8/1998 | Wong | 361/685 |
| 5,825,616 | 10/1998 | Howell et al. | 361/684 |

FOREIGN PATENT DOCUMENTS

S68754  7/1996  Ireland.

*Primary Examiner*—Lynn D. Feild
*Attorney, Agent, or Firm*—Woodcock Washburn Kurtz Mackiewicz & Norris LLP

[57] ABSTRACT

A carrier for an electronic device such as a disk drive comprises a hollow casing for accomodating the electronic device. The casing is configured for sliding insertion into and out of a rack having a back plane with at least one lamp which in use indicates the status of the electronic device. At least one light guide extends from the front to the rear of the casing. The rear end of the light guide is in register with the lamp when the casing is inserted in the rack and light emerging from the front end of the light guide is visible at the front of the casing. Thus the status of the device can be ascertained without the need for lamps on the front of the carrier and attendant wiring from the back plane.

3 Claims, 10 Drawing Sheets

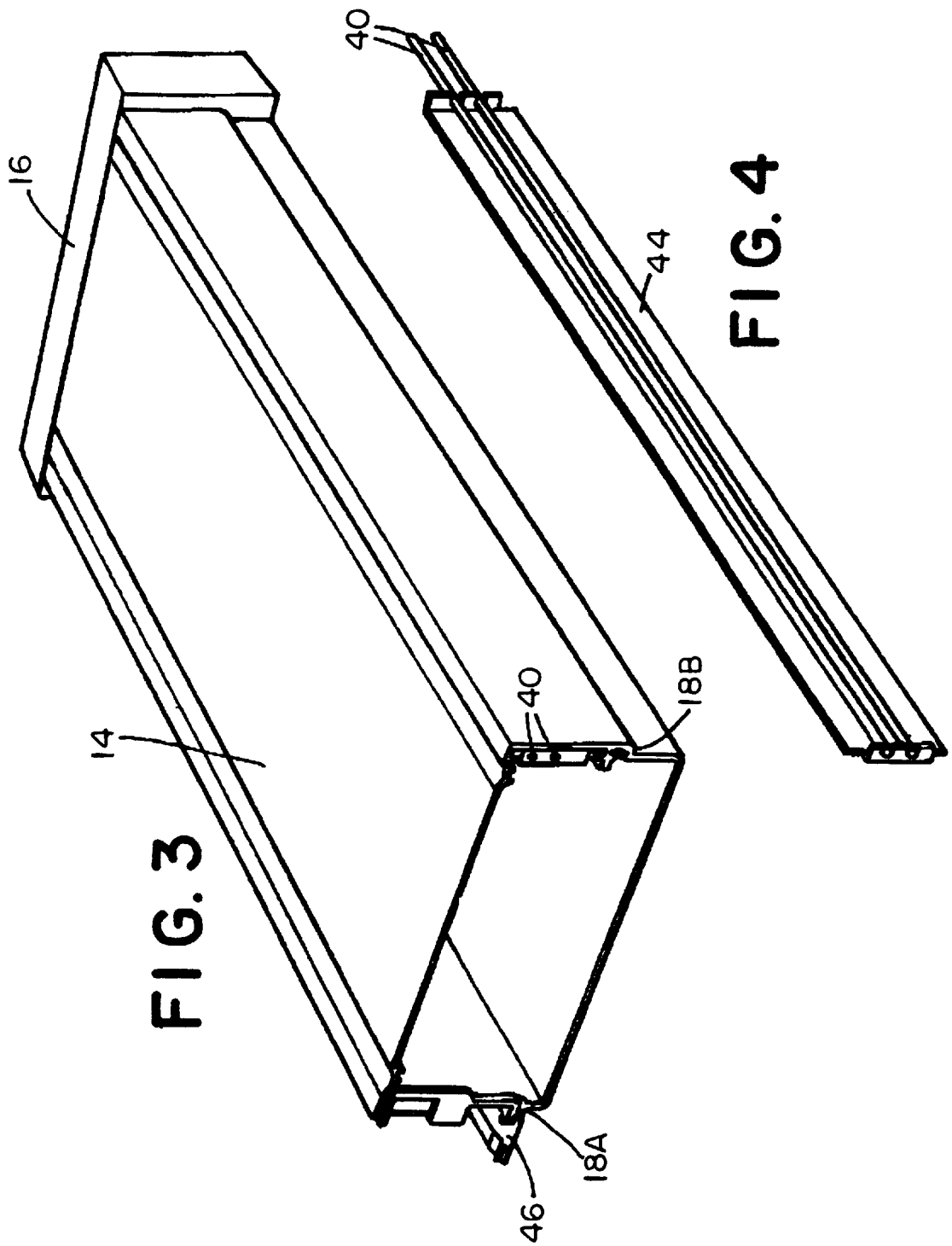

CARRIER FOR AN ELECTRONIC DEVICE

This invention relates to a carrier for an electronic device, for example a disk drive for data storage.

According to the invention there is provided a carrier for an electronic device, the carrier comprising a hollow casing for accomodating the electronic device, which casing is configured for sliding insertion into and out of a rack having at least one lamp at the rear of the rack which in use indicates the status of the electronic device, and at least one light guide extending from the front to the rear of the casing, wherein the rear end of the light guide is in register with the lamp when the casing is inserted in the rack and wherein light emerging from the front end of the light guide is visible at the front of the casing.

Figure 1:
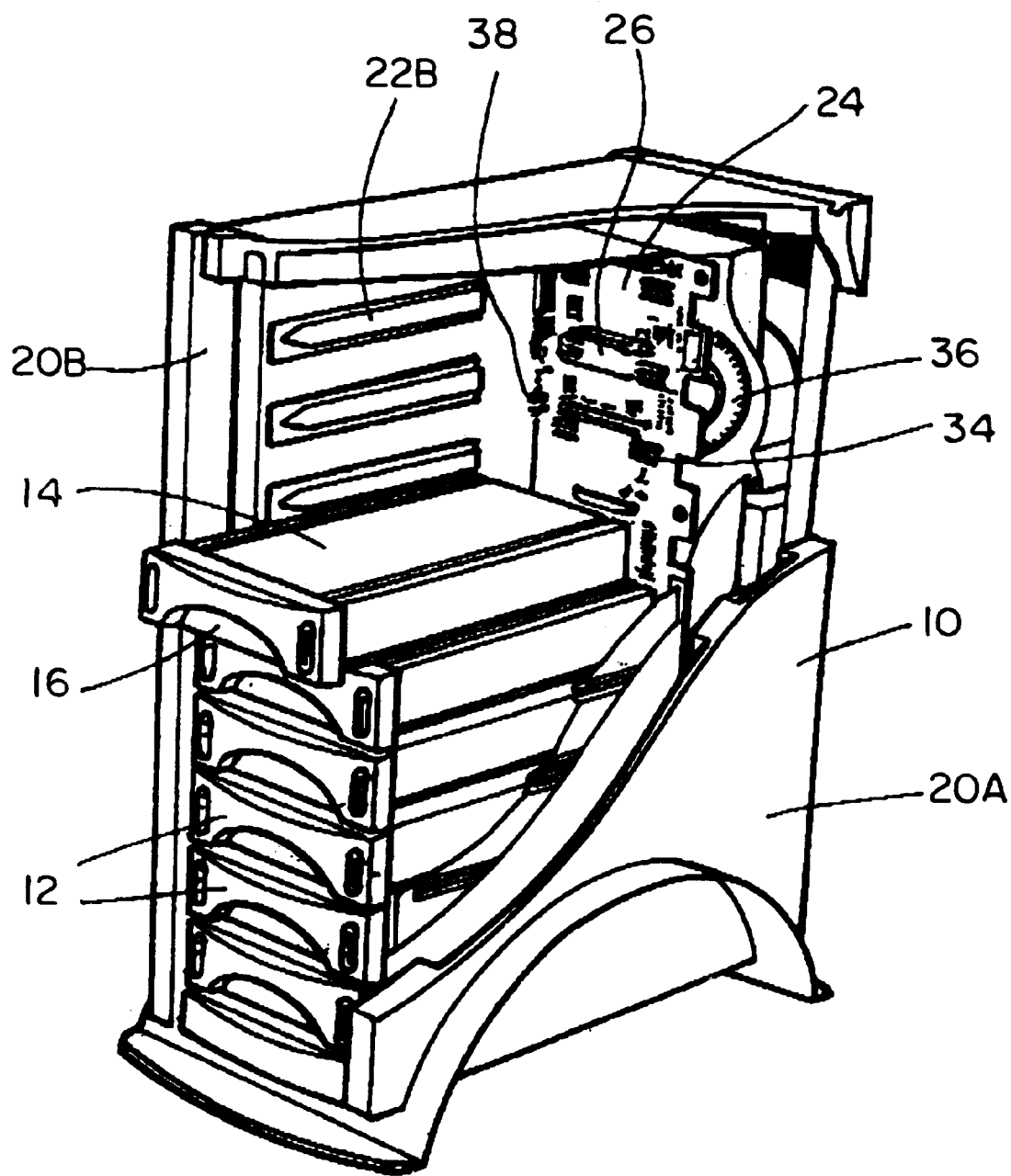
Figure 2:
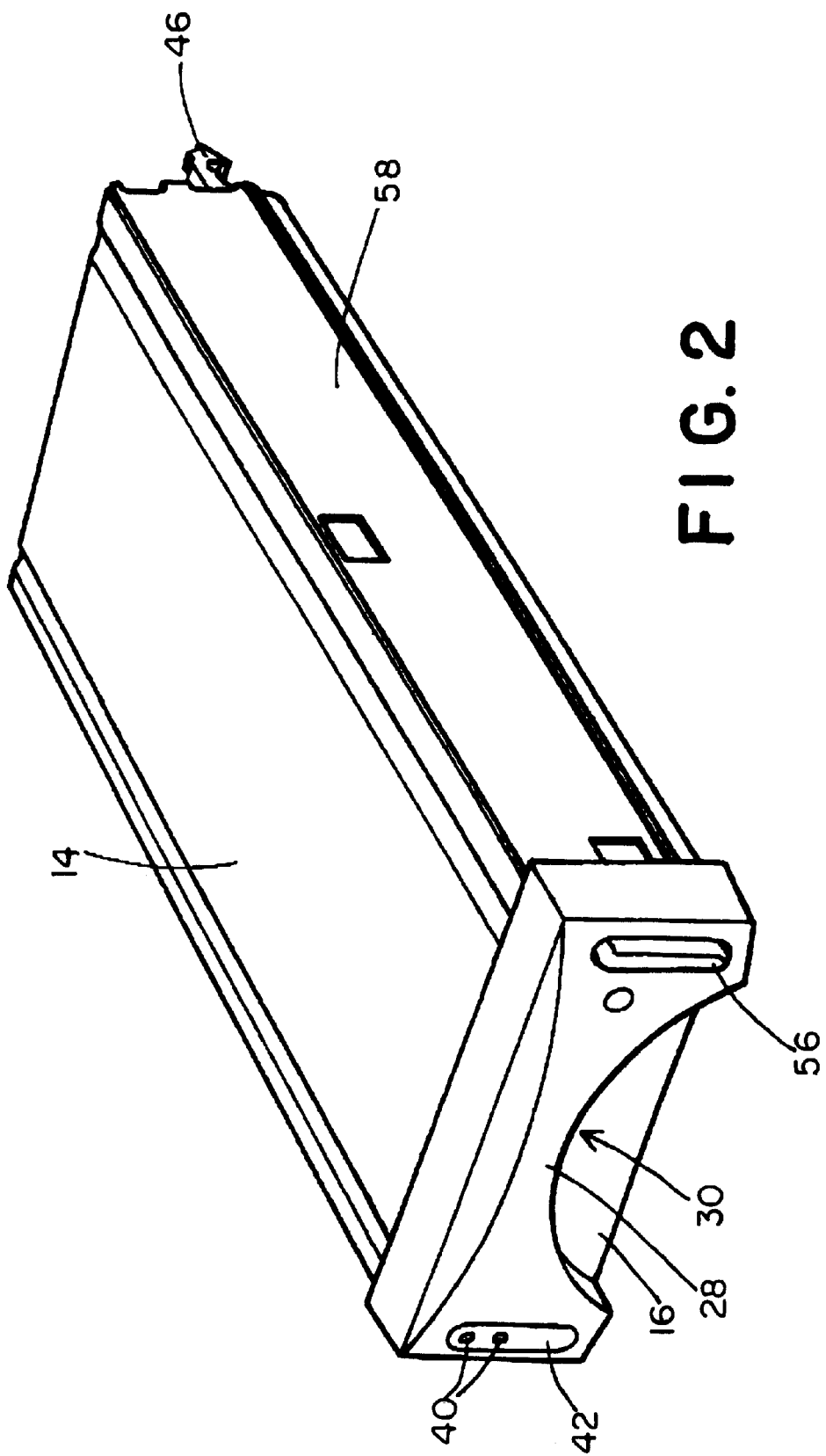
Figure 5:
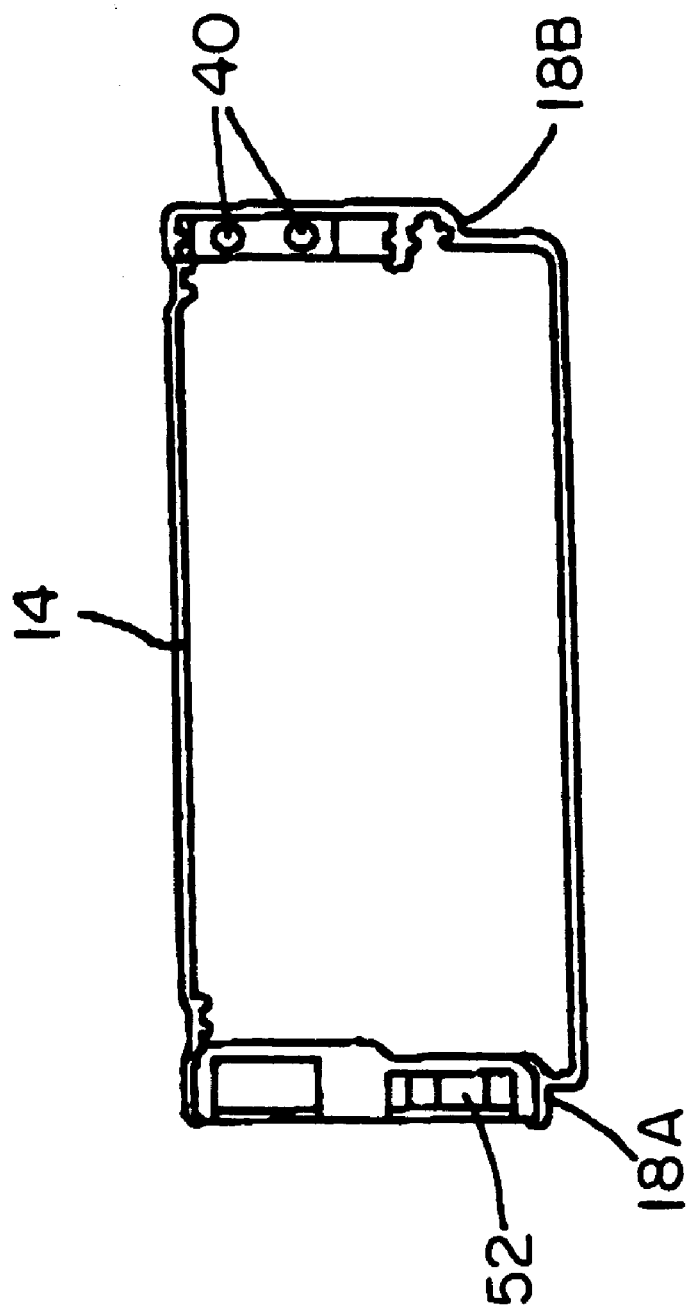
Figure 6:
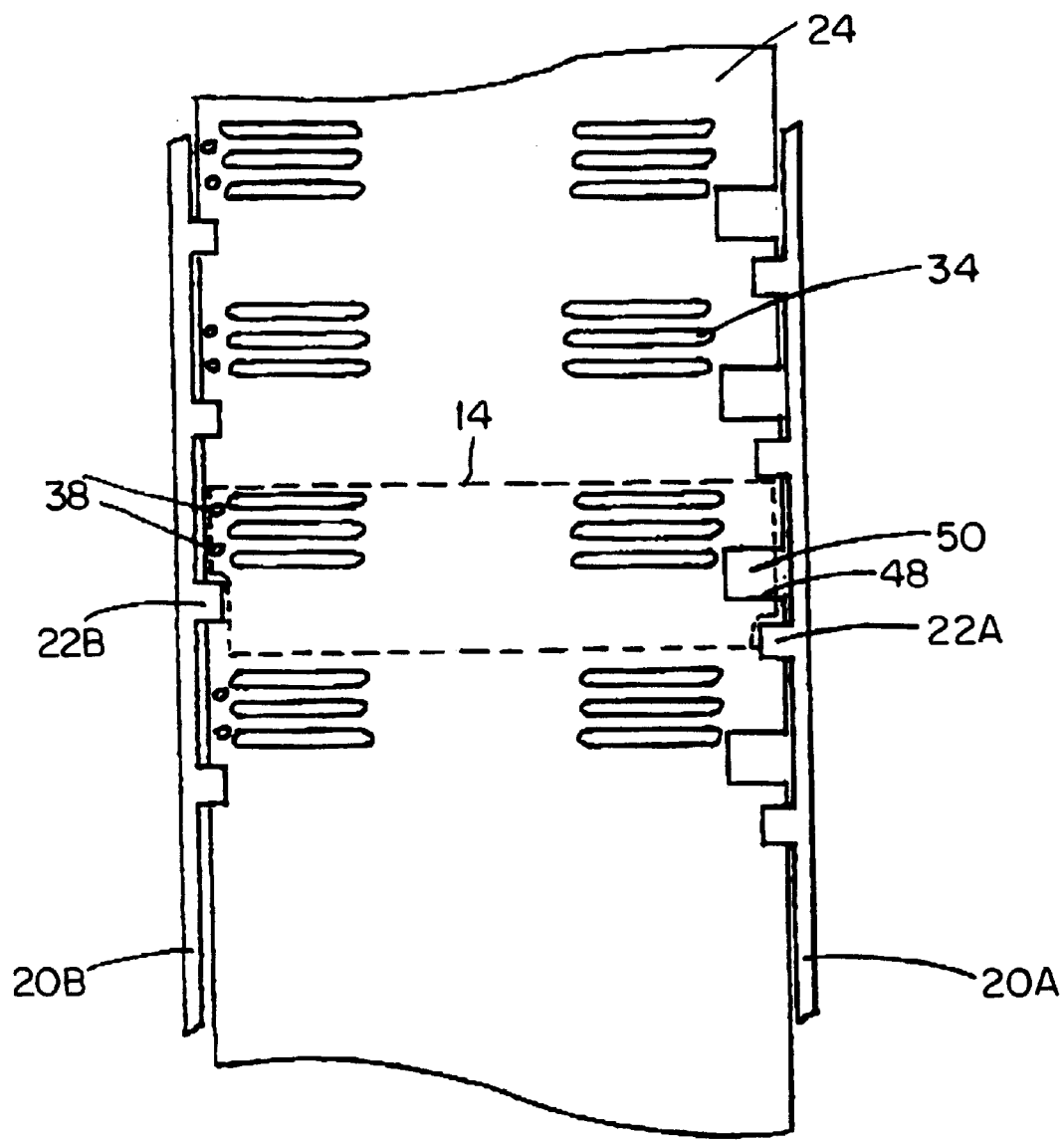
Figure 7:
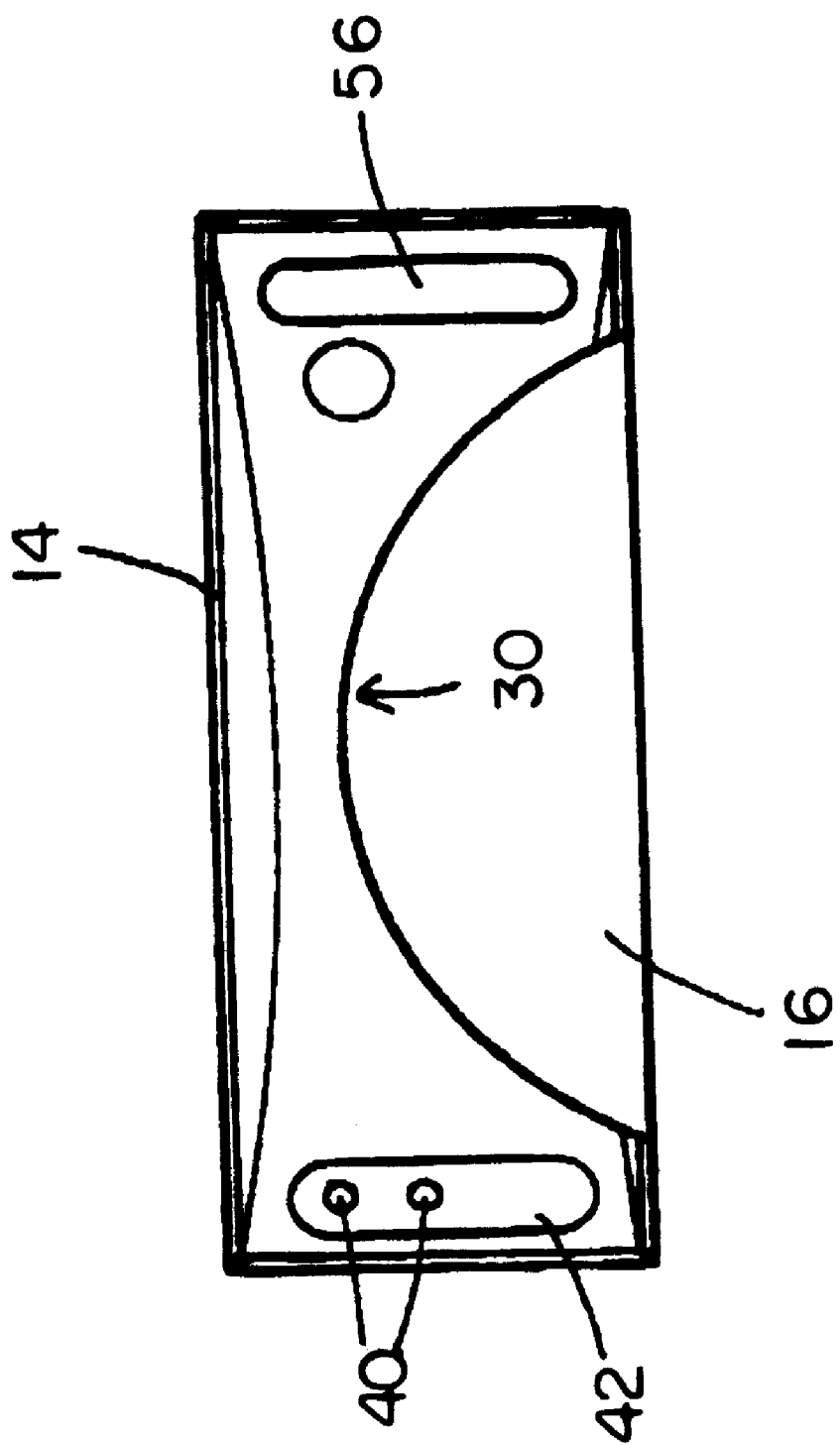
Figure 8:
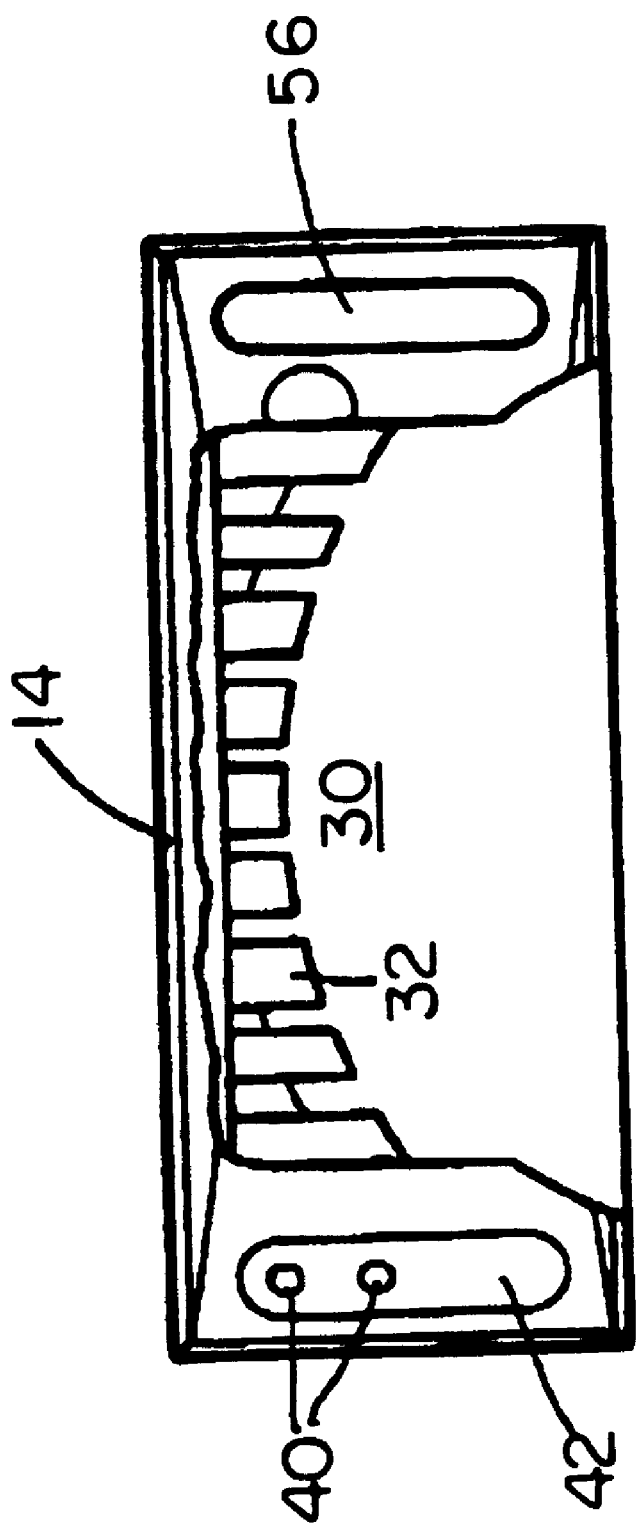
Figure 9:
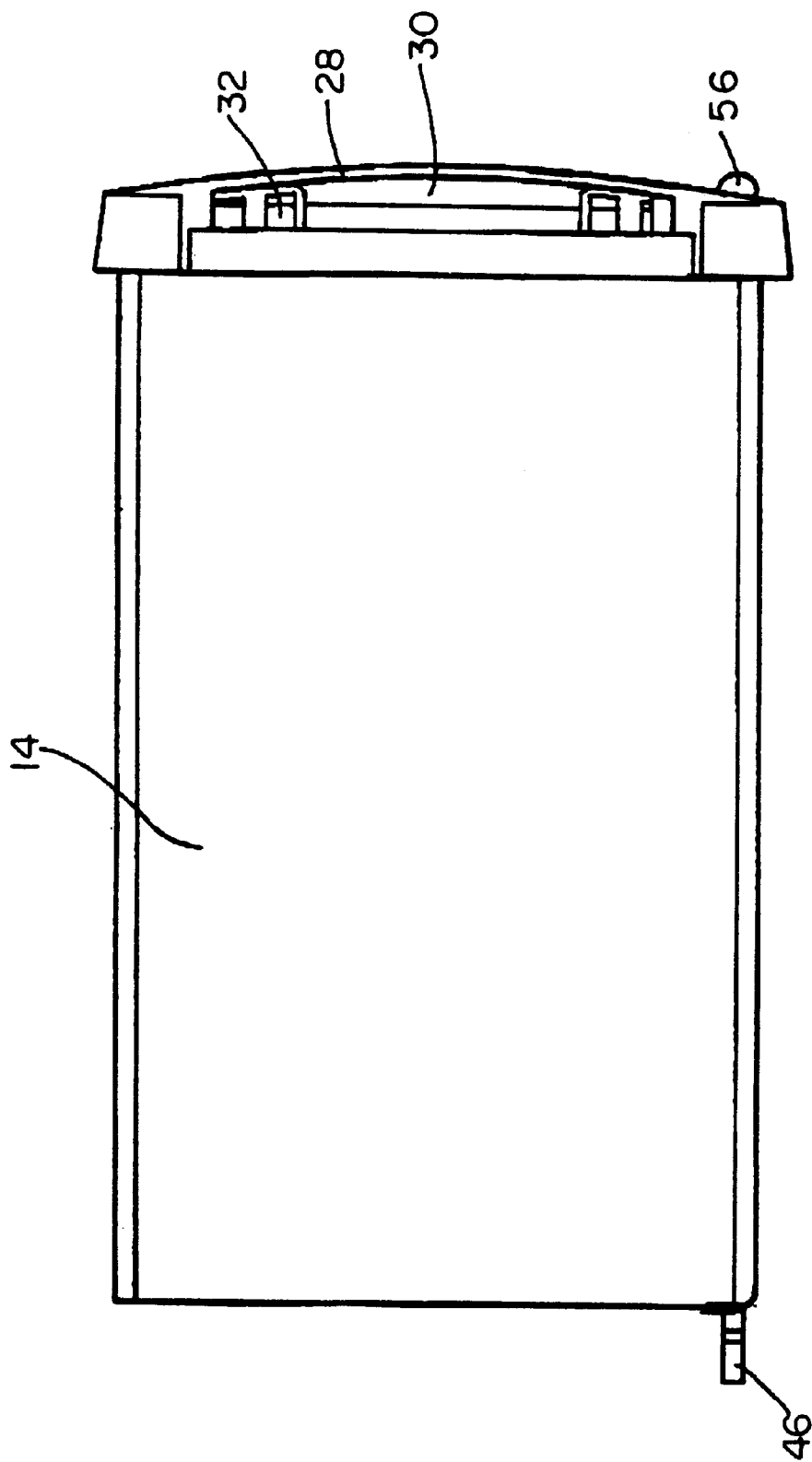
Figure 10:
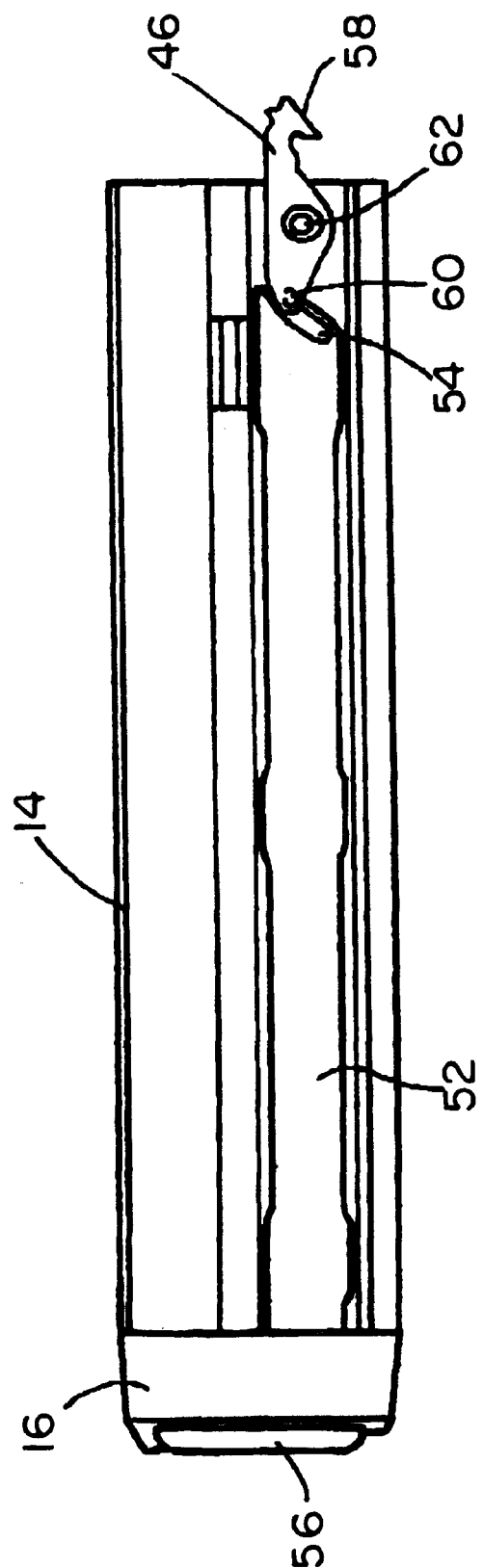
Figure 11:
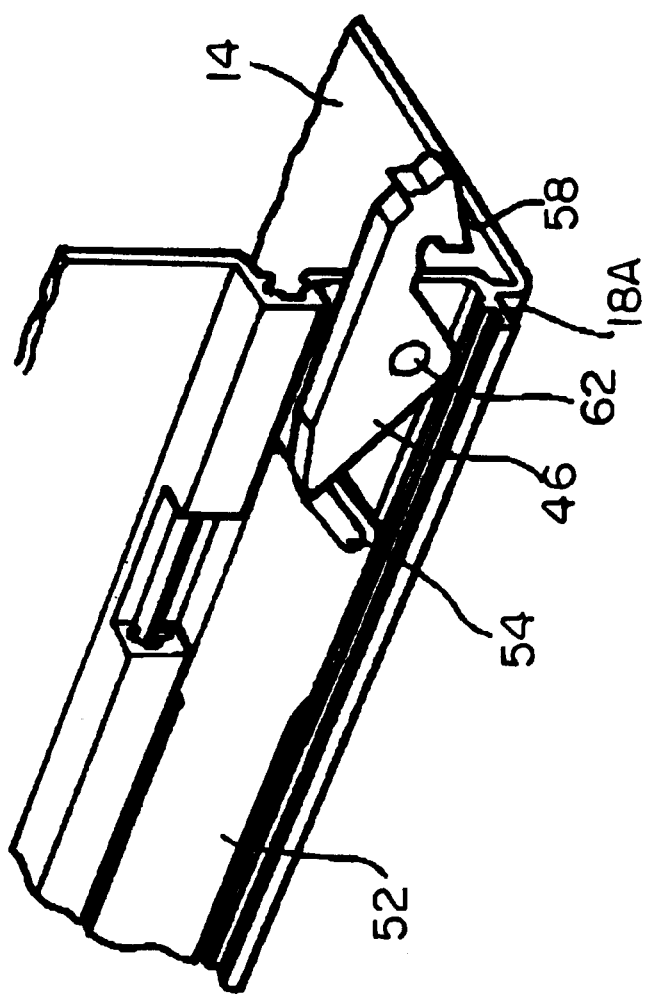

An embodiment of the invention will now be described, by way of example, with reference to the accompanying drawings, in which:

FIG. 1 is a perspective view of a rack holding a number of electronic device carriers according to an embodiment of the invention, the rack being partially cut away to show part of the back plane, FIG. 2 is a front three-quarter perspective view of one of the device carriers of FIG. 1, FIG. 3 is a rear three-quarter perspective view of the device carrier, FIG. 4 shows light pipes incorporated in the device carrier, FIG. 5 is a vertical cross-section through the device carrier, FIG. 6 is a simplified view of the rack as seen from the front, such view being simplified to omit much of the detail of the back plane, FIG. 7 is a front view of the device carrier, FIG. 8 is a front view of the device carrier with the handle partially cut away, FIG. 9 is an underneath view of the device carrier, FIG. 10 is a side view of the device carrier with the latch mechanism exposed, and FIG. 11 is a detailed view of the part of the latch mechanism at the rear of the device carrier.

Referring now to the drawings, a rack 10, FIG. 1, accomodates a plurality of device carriers 12 which are independently and removably inserted in the rack one above the other. Each device carrier 12 comprises a hollow casing 14 having a substantially constant rectangular cross-section. The casing 14, which may be made of extruded aluminium, is open at the rear and closed at the front by a panel 16. The casing 14 is adapted to accomodate an electronic device, not shown, such as a disk drive for data storage. Although the following will primarily describe the construction and operation ot one of the device carriers 12, it will be understood that such description applies to each of the device carriers 12.

A respective shoulder 18a, 18b is provided along each side of the casing 14, as most clearly seen in FIGS. 3 and 5. These shoulders are at slightly different heights on either side of the casing 14. The rack 10 has opposite parallel sidewalls 20a, 20b, and on its internal surface each sidewall 20a, 20b has a respective set of parallel runners 22a, 22b disposed horizontally one above the other. Each runner 22a on the sidewall 20a is slightly higher than a corresponding runner 22b on the sidewall 20b, the difference in height between opposite pairs of runners 22a, 22b being equal to the difference in height between the shoulders 18a and 18b. When the casing 14 is inserted into or withdrawn from the rack 10 the shoulders 18a, 18b slide along a corresponding pair of the runners 22a, 22b, and the matching differences in height of the pair of shoulders and the pair of runners ensure that the casing extends substantially horizontally between the sidewalls 20a, 20b.

The rack 10 has a back plane 24 bearing electronic circuitry 26 for operating the disk drive or other electronic device in the casing 14. The electronic device has an edge connector (not shown) projecting from the rear of the casing 14 and when the casing is fully inserted into the rack 10 the edge connector mates with a complementary edge connector associated with the electronic circuitry 26 on the back plane 24. This enables power, control and data tracks on the back plane to be electrically connected to the electronic device in the casing 14, thus enabling remote control and transfer of data to and from the electronic device. The construction and operation of such edge connectors in rack systems is well known in the art. The device carrier 12 is releasably retained in its fully inserted position in the rack 10 by a latch mechanism to be described.

The front panel 16, which may be moulded of plastics material, includes an integral handle 28. The handle 28 extends fully across the width of the front panel 16 and defines a blind recess 30 extending upwardly behind the handle. The front panel 16 further includes a plurality of vertical ventilation slots 32, FIG. 8, which are hidden behind the handle 28 in the blind recess 30. The back plane 24 has two sets of horizontal ventilation slots 34 directly behind each carrier 12. Fans 36 are mounted behind the back plane 24 which, in use, draw cooling air through the ventilation slots 32, over the top of the electronic device in the casing 14, and finally through the ventilation slots 34 in the back plane 24.

The electronic circuitry 26 includes two LEDs 38 mounted on the back plane 24 behind each device carrier 12. In use these LEDs act as indicators of the operating status of the electronic device in the casing 14.

A pair of light guides in the form of optical fibres 40 are mounted on the inside of the casing 14 above the shoulder 18b and extend fully from the front to the rear of the casing 14. When the casing 14 is fully inserted into the rack 10 the rear end of each light guide 40 is directly in front of a respective one of the LEDs 38 so that light from the LED enters the light guide and is conducted to the front end thereof by total internal reflection. The front ends of the light guides 40 terminate just behind a window 42 in the front panel 16, so that the light emerging from the front ends of the light guide is visible at the front of the casing. Hence, a user can ascertain the operating status of the device in the carrier 12 via the front panel window 42 and light guides 40. This avoids the need for separate LEDs or other status indicator lamps at the front panel 16 and attendant wiring from the back plane through the casing 14. As seen in FIG. 4, the light guides 40 are mounted on an elongated panel 44 which can be slid into the carrier 12 along grooves in the casing 14.

As mentioned, the device carrier 12 is releasably retained in its fully inserted position in the rack 10 by a latch mechanism.

The latch mechanism includes a hook member 46 mounted on the outside of the casing 14 adjacent the rear end thereof above the shoulder 18a, the hook member 46 projecting beyond the rear end of the casing 14. The hook member 46 is pivotted at 62 for rotation in a vertical plane between a latched position in which the hook member 46 engages behind the top edge 48 (FIG. 6) of a cut-out 50 in the back plane 24 to retain the casing 14 in the fully inserted position in the rack 10, and an unlatched position in which the hook member 46 disengages the top edge 48 to permit the casing 14 to be withdrawn from the rack.

An actuating rod 52 extends from the front of the casing 14 to the hook member 46 and is slidable longitudinally relative to the casing 14. The rear end of the rod 52 has an inclined slot 54 and the hook member 46 has a projection 60, FIG. 10, which extends into the slot 54 in the manner of a cam follower such that to and fro movement of the actuating rod 52 causes rotation of the hook member 46 between its latched and unlatched positions. Compression spring means (not shown) biasses the rod 52 towards the front of the casing 14, thereby tending to rotate the hook member 46 to its latched position. A push button 56 in the front panel 16 is coupled to the rod 52 such that by pressing on the push button 56 the rod 52 may be moved manually towards the rear of the casing 14 to rotate the hook member 46 to its unlatched position against the spring bias. The rod 52 and the forward part of the hook member 46 are normally covered by a panel 58.

In use, when the carrier 12 is inserted into the rack 10 by sliding along the runners 22a, 22b, the hook member 46 is in its latched position. As the carrier 12 approaches its fully inserted position, an inclined front edge 58 of the hook member 46 engages and rides up over the top edge 48 of the cut out 50. Finally, when the carrier 12 reaches its fully inserted position the front edge 58 of the hook member clears the top edge 48 of the cut out 50 and the hook member engages behind the top edge 48 to retain the carrier in the fully inserted position When it is requires to withdraw the carrier 12 from the rack 10, the push button 56 is pressed which rotates the hook member 46 against the spring bias to its unlatched position clear of the top edge 48, allowing the carrier 12 to be withdrawn.

What is claimed is:

1. Electronic equipment including a carrier for an electronic device, the carrier comprising a hollow casing for accommodating the electronic device, and a rack, the casing being configured for sliding insertion into and out of the rack, the equipment further including latch means mounted on the carrier for releasably retaining the casing in the rack, wherein the latch means includes a hook member pivoted to the carrier adjacent the rear end of the casing, the hook member being pivoted for rotation between a latched position in which the hook member engages behind a portion of the rack to retain the casing in the rack and an unlatched position in which the hook member disengages the said portion of the rack to permit the casing to be withdrawn from the rack, an elongated actuating member mounted on the carrier extending from the front of the casing to the hook member and slidable longitudinally relative to the casing, the rear end of the actuating member having an inclined slot and the hook member having a projection which extends into the slot in the manner of a cam follower such that to and from movement of the actuating member causes rotation of the hook member between its latched and unlatched positions, and spring means biasing the actuating member to a position where the hook member is in its latched position, the actuating member being manually movable from the front of the casing to rotate the hook member to its unlatched position against the spring bias.

2. Electronic equipment as claimed in claim 1, wherein the casing has a front panel which includes a handle extending across the width of the front panel, the handle defining a blind recess extending upwardly behind the handle, the front panel further including a plurality of ventilation apertures hidden behind the handle in the blind recess.

3. Electronic equipment as claimed in claim 1 further including at least one lamp at the rear of the rack which in use indicates the status of the electronic device and at least one light guide extending from the front to the rear of the casing, wherein the rear end of the light guide is in register with the lamp when the casing is inserted in the rack and wherein light emerging from the front end of the light guide is visible at the front of the casing.

* * * * *